(12) United States Patent
Knudsen

(10) Patent No.: US 10,511,916 B2
(45) Date of Patent: Dec. 17, 2019

(54) INTEGRATED CIRCUIT COMPONENT FOR A HEARING ASSISTIVE DEVICE

(71) Applicant: WIDEX A/S, Lynge (DK)

(72) Inventor: Niels Ole Knudsen, Humlebak (DK)

(73) Assignee: Widex A/S, Lynge (DK)

( * ) Notice: Subject to any disclaimer, the term of this patent is extended or adjusted under 35 U.S.C. 154(b) by 0 days.

(21) Appl. No.: 15/847,347

(22) Filed: Dec. 19, 2017

(65) Prior Publication Data

US 2018/0176695 A1 Jun. 21, 2018

Related U.S. Application Data

(60) Provisional application No. 62/436,811, filed on Dec. 20, 2016.

(51) Int. Cl.
*H04R 25/00* (2006.01)
*H03M 3/00* (2006.01)

(52) U.S. Cl.
CPC ............ *H04R 25/453* (2013.01); *H03M 3/39* (2013.01); *H03M 3/464* (2013.01); *H04R 25/505* (2013.01); *H04R 25/604* (2013.01)

(58) Field of Classification Search
CPC ...... H04R 29/005; H04R 3/00; H04R 19/005; H04R 19/04; H04R 2201/003; H04R 25/30; H04R 3/12; H04R 1/20; H04R 1/005; H04R 1/42
See application file for complete search history.

(56) References Cited

U.S. PATENT DOCUMENTS

| 4,768,018 | A | * | 8/1988 | Noujaim | H02H 1/0007 341/143 |
|---|---|---|---|---|---|
| 4,792,886 | A | | 12/1988 | Sahm | |
| 5,907,235 | A | | 5/1999 | Blumenkrantz et al. | |
| 6,225,792 | B1 | | 5/2001 | Blumenkrantz et al. | |
| 7,489,791 | B2 | | 2/2009 | Van Der Zwan et al. | |
| 7,492,296 | B1 | | 2/2009 | Drakshapalli et al. | |
| 8,855,335 | B2 | | 10/2014 | Henriksen | |

(Continued)

FOREIGN PATENT DOCUMENTS

| EP | 2421281 | * | 9/2010 | ............ H04R 19/04 |
|---|---|---|---|---|
| EP | 2421281 A2 | | 2/2012 | |

OTHER PUBLICATIONS

Communication dated May 23, 2018, from European Patent Office in counterpart application No. 17201260.1.

*Primary Examiner* — Amir H Etesam
(74) *Attorney, Agent, or Firm* — Sughrue Mion, PLLC

(57) ABSTRACT

A hearing assistive device having an input transducer (18) for picking up sound from the environment, a digital signal processor (27) for alleviating a hearing loss of a specific user by compensating an audio signal according to the users hearing deficit, and an output transducer (29) for reproducing the compensated audio signal. The hearing assistive device further includes an integrated circuit component (40) having at least one analog-to-digital converter adapted for receiving an audio input signal from a microphone and providing a data output for signal processing. The at least one analog-to-digital converter includes an AC filter (50) preventing audible signal losses towards the microphone, and the AC filter (50) is provided with all components integrated in the integrated circuit component (40).

17 Claims, 2 Drawing Sheets

(56) References Cited

U.S. PATENT DOCUMENTS

| | | |
|---|---|---|
| 2001/0005128 A1 | 6/2001 | Blumenkrantz et al. |
| 2002/0106091 A1* | 8/2002 | Furst .................. H04R 19/04 |
| | | 381/91 |
| 2006/0050910 A1 | 3/2006 | Danielsen |
| 2007/0252736 A1 | 11/2007 | Farooqi et al. |
| 2008/0106447 A1 | 5/2008 | Zare-Hoseini et al. |
| 2012/0121106 A1 | 5/2012 | Henriksen |
| 2012/0319880 A1 | 12/2012 | Matsumoto et al. |
| 2013/0064407 A1 | 3/2013 | Hoevesteen |
| 2013/0249726 A1 | 9/2013 | Knudsen |
| 2014/0167991 A1 | 6/2014 | Oshita et al. |
| 2015/0092971 A1* | 4/2015 | Kim .................. H04R 25/558 |
| | | 381/328 |
| 2015/0189448 A1 | 7/2015 | Siegumfeldt et al. |
| 2016/0087596 A1 | 3/2016 | Yurrtas et al. |
| 2017/0047939 A1 | 2/2017 | Zanbaghi et al. |

\* cited by examiner

INTEGRATED CIRCUIT COMPONENT FOR A HEARING ASSISTIVE DEVICE

BACKGROUND OF THE INVENTION

The present invention relates to an integrated circuit component for a hearing assistive device. The invention, more particularly, relates to an integrated circuit component receiving an audio input signal from a microphone. Also, the invention relates to a hearing assistive device having such an integrated circuit component.

When designing a hearing assistive device or a hearing aid, it is desirable to prevent DC from a microphone to enter into the A/D converter of the device, as the DC of the microphone may overload the converter or limit the dynamic range Traditionally DC has been prevented from entering the A/D converter by providing a capacitor between the microphone and the A/D converter. However discrete, external components are undesired from a cost and manufacturing perspective.

SUMMARY OF THE INVENTION

The purpose of the invention is to provide an integrated circuit component for use a hearing assistive device and adapted to enable AC-coupling directly to an AD converter or delta sigma converter on an integrated circuit component.

This purpose is according to the invention achieved by an integrated circuit component for a hearing assistive device and comprising at least one analog-to-digital converter adapted for receiving an audio input signal from a microphone and providing a data output for signal processing. The at least one analog-to-digital converter includes an AC filter preventing audible signal losses towards the microphone, and wherein the AC filter is provided with all components integrated in the integrated circuit component. The integrated circuit component according to the invention enables AC coupling directly into the chip in a delta sigma converter The AC filter includes a coupling capacitor and a resistive element. The resistive element is preferably provided by a pair of parallel and opposite diodes, as diodes exhibit very high resistance on a small silicon area and consequently these are attractive to use when high resistance is required.

The capacitor of the AC filter is connected between the feedback node of the at least one delta sigma converter and a virtual ground node, whereby the capacitor effectively blocks DC from the feedback node.

The diodes are connected between the output of a first amplifier in the at least one delta sigma converter and the virtual ground node, whereby the first amplifier receives DC feedback via the diodes. This will effectively bias the output first amplifier to a voltage potential corresponding to the virtual ground potential.

According to a second aspect of the invention there is provided a hearing assistive device comprising an input transducer for picking up sound from the environment, a digital signal processor for alleviating a hearing loss of a specific user by compensating an audio signal according to the users hearing deficit, and an output transducer for reproducing the compensated audio signal. The hearing assistive device further comprises an integrated circuit component having at least one analog-to-digital converter adapted for receiving an audio input signal from a microphone and providing a data output for signal processing. The at least one analog-to-digital converter includes an AC filter preventing audible signal losses towards the microphone; and the AC filter is provided with all components integrated in the integrated circuit component (40).

BRIEF DESCRIPTION OF THE DRAWINGS

The invention will be described in further detail with reference to preferred aspects and the accompanying drawing, in which.

DETAILED DESCRIPTION

Figure 1:
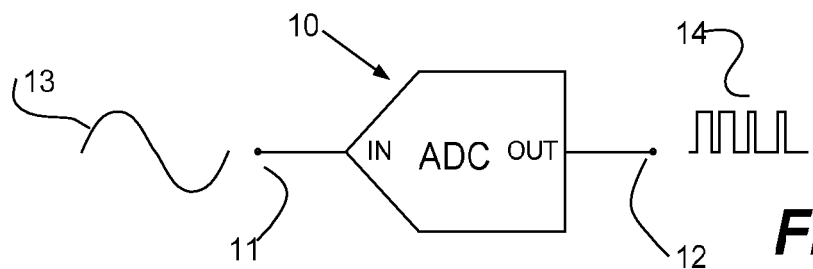
FIG. 1 illustrates schematically the operation of a sigma-delta converter.

Reference is made to FIG. 1, which schematically illustrates a delta sigma converter 10 converting an analog voltage or analog signal 13 received on an input 11 into a digital representation 14 delivered on an output 12. The digital representation 14 is known as Pulse Density modulation or Pulse Frequency modulation. In general, frequency may vary smoothly in infinitesimal steps, as may voltage, and both may serve as an analog of an infinitesimally varying physical variable such as a speech signal or an acoustic signal. The substitution of frequency for voltage is thus entirely natural and carries in its train the transmission advantages of a pulse stream.

Most A/D converters, including the sigma-delta converter 10, require input from a reference voltage. The input voltage to the A/D converter is measured relative to this reference voltage. Hence, it is important that the reference voltage has sufficiently low noise.

The delta sigma converter 10 converts the mean of the analog voltage into the mean of the analog pulse frequency and counts the pulses in a known interval so that the pulse count divided by the interval gives an accurate digital representation of the mean analog voltage during the interval. This interval can be chosen to give any desired resolution or accuracy.

Figure 2:
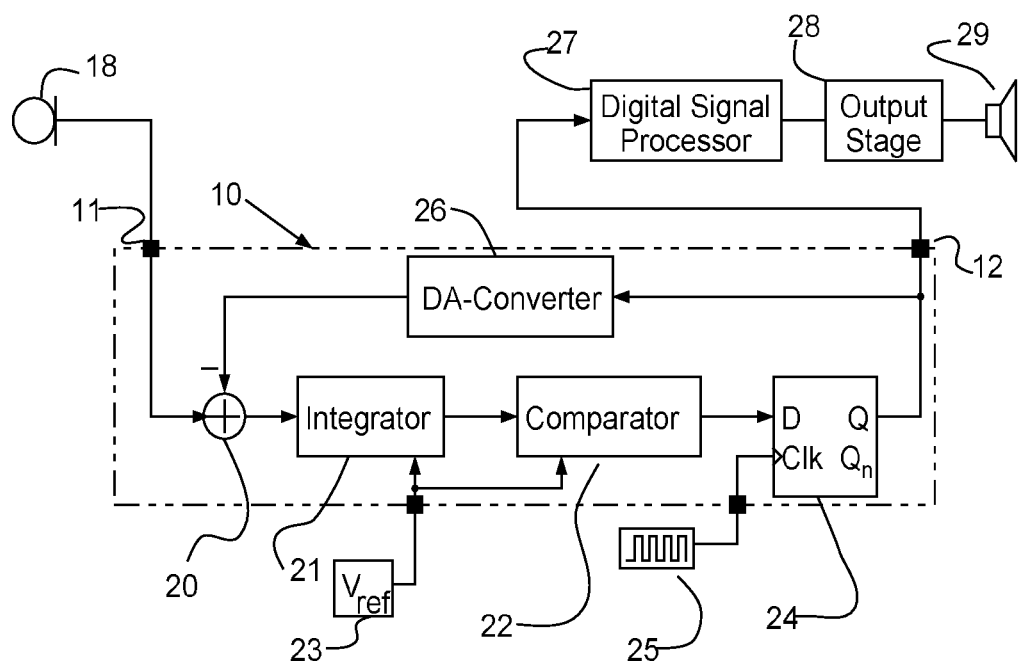
FIG. 2 illustrates schematically a hearing assistive device according to an embodiment of the invention.

FIG. 2 illustrates schematically a hearing assistive device according to an embodiment of the invention. The hearing assistive device includes an example of an A/D converter. This converter is a 1-bit time-continuous delta sigma converter of first order, but the principles according to the invention apply to all converter types. The hearing assistive device may be a hearing aid.

Figure 3:
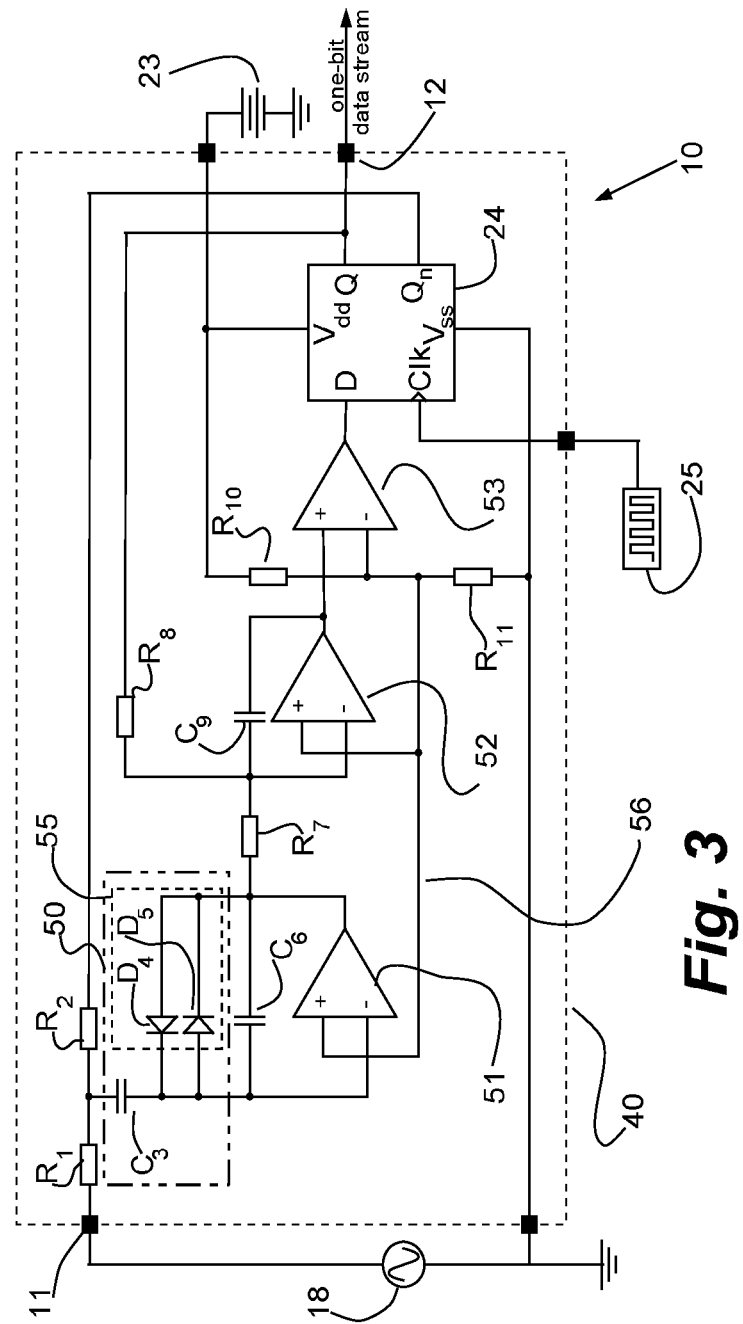
FIG. 3 illustrates schematically an embodiment of an integrated circuit component according to the invention.

The hearing assistive device has at least one input transducer or microphone 18 picking up an audio signal and transforms it into an electric representation, e.g. the analog signal 13. The delta sigma converter 10 receives the analog signal 13 at the input 11, and is implemented on an ASIC or integrated circuit component 40 (shown in FIG. 3) manufactured from a CMOS process. On the input 11, the delta sigma converter 10 receives an analog electrical signal and on the output it delivers a one-bit digital bit stream. The ASIC may contain multiple, parallel delta sigma converters 10.

A feedback voltage from a feedback loop is subtracted from the transformed voltage in the summation point 20, and the resulting signal is supplied to an integrator 21 performing a time integration of the signal voltage from the summation point 20. The integrator 21 will have a low pass filtering effect. The integral signal provided as the output from the integrator 21 will increase or decrease depending on whether the signal voltage from the summation point 20 is positive or negative.

The integral signal from the integrator 21 is presented to the input of a comparator 22 for generating a logical "1"-level whenever the integral signal exceeds a reference voltage $V_{ref}$ presented to the comparator 22, and a logical "0"-level whenever the integral signal from the integrator 21 is below the reference voltage $V_{ref}$. By using a battery supply dependent reference voltage, the dynamic range and clipping level in the A/D converter, the delta sigma converter 10, will become increased. With a suitable microphone 18 the hearing aid will be able to handle a larger dynamic range.

The reference voltage $V_{ref}$ is provided to be lower than the power supply formed by the battery $V_{battery}$ in order to ensure headroom for removing power supply noise by filtering and preventing rapid changes of the voltage that would generate audible artifacts.

The binary output from the comparator 22 feeds the data input of a D flip-flop 24. The D flip-flop 24 captures the value of the D-input at a definite portion of the clock cycle, such as the rising edge of a clock signal. That captured value of the D-input becomes the Q output until the next definite portion of the clock cycle occurs and a new value of the D-input is captured and becomes the next Q output.

The clock frequency of the clock signal from a clock signal generator 25 defines the bit rate of the output signal 14 from the delta sigma converter 10. In the illustrated embodiment the clock frequency is stable in the range of 1-2 MHz.

The bit stream from the flip-flop 24 is provided at the output 12 of the delta sigma converter 10 as a digital audio signal to a digital signal processor 27. The digital signal processor 27 is preferably a specialized microprocessor with its architecture optimized for the operational needs of digital signal processing, and in the illustrated embodiment the processor 27 is adapted for amplifying and conditioning of the audio signal intended to become presented for the hearing aid user. The amplification and conditioning is carried out according to a predetermined setting in order to alleviate a hearing loss by amplifying sound at frequencies in those parts of the audible frequency range where the user suffers a hearing deficit.

The processor 27 outputs according to one embodiment of the invention a digital signal fed to a digital output stage 28 and an output transducer or a speaker 29. The speaker 29 may be driven as a class D amplifier by the one-bit digital data stream received.

The output 12 of the delta sigma converter 10 is branched to provide a part of the data stream to a feedback loop. In the feedback loop, the part of the data stream is forwarded to a 1-bit D/A converter 26 converting the logical ones and zeros in the part of the data stream into a positive or negative voltage with respect to the transformed voltage for subtraction from the transformed voltage in the summation point 20.

The invention enables AC-coupling directly to the delta sigma converter on a chip. It is desirable to prevent DC-voltage from the microphone 18 from entering into the A/D converter or the delta sigma converter 10 in the hearing aid, as the DC-voltage of the microphone 18 may overload the A/D converter or the delta sigma converter 10, or limit the dynamic range.

In some embodiments it is for power consumption reasons desired to couple the microphone 18 directly to the delta sigma converter 10 without having a preamplifier between the microphone 18 and the delta sigma converter 10. In order to prevent DC from entering the delta sigma converter 10, a high-pass filter (not shown) may be inserted between the microphone 18 and the delta sigma converter 10. The delta sigma converter 10 may be implemented as a first, a second, or a higher order time-continuous delta sigma converter. The delta sigma converter may employ a discrete time delta sigma topology as well as a time continuous topology. The high-pass filter (not shown) following the microphone 18 must have cut off frequency lower than 100 Hz, preferably lower than 50 Hz in order to prevent audible signal losses. Often this requires a capacitance value that far exceeds what can be achieved on chip. The capacitor must therefore be mounted outside the chip with the delta sigma converter 10.

The invention relates to an AC coupling circuit for a delta sigma A/D converter 10 provided on an ASIC. It is desirable to prevent DC from a microphone from entering into the delta sigma A/D converter 10 in a hearing aid, as the DC from the microphone 18 may overload or limit the dynamic range of the delta sigma A/D converter 10.

According to the invention, the delta sigma converter 10 is implemented as a set of electronic circuits on one small piece of semiconductor material, e.g. silicon of an integrated circuit component 40. The integrated circuit component 40 can be made much smaller than a discrete circuit made from independent electronic components. However, there are some limitations, as capacitors will be limited in size, e.g. approximately 100 pF. The integrated circuit component 40 is marked with dotted lines in FIG. 3, and the contact pads, e.g., for the audio input 11, the digital output 12, ground, the clock signal and the supply voltage are marked with black squares on FIG. 3.

The feedback network for the delta sigma converter 10 comprises a voltage divider having two resistors $R_1$ and $R_2$ provided between the $Q_n$ output of the D flip-flop 24 and the input 11. The input 11 is actually a connection terminal for an integrated circuit component 40. By using the $Q_n$ output for the feedback loop, the output signal Q from the D flip-flop 24 will be subtracted from input signal originating from the microphone 18 at the feedback node (the output of the voltage divider).

According to the invention, the delta sigma converter includes an AC filter 50 having a cut off frequency lower than, e.g., 100 Hz. The purpose of the AC filter 50 is to prevent audible signal losses. According to the invention, the AC filter 50 is provided with all components integrated in the semiconductor material of the integrated circuit component 40. The AC filter 50 includes an AC coupling capacitor $C_3$ and a pair of parallel and opposite diodes $D_4$ and $D_5$ providing the required resistance. The diodes ($D_4$, $D_5$) provide a resistive element (55) for the AC filter 50. Diodes exhibit very high resistance on a small silicon area, and consequently these are attractive to use when high resistance are required.

The capacitor $C_3$ of the AC filter 50 is connected between the feedback node and a virtual ground node 56. The diodes $D_4$ an $D_5$ are connected between the output of the first amplifier 51 and the virtual ground node 56. The capacitor $C_3$ effectively blocks DC from the feedback node.

The first amplifier 51 receives DC feedback via the diodes $D_4$ an $D_5$. This will effectively bias the output first amplifier 51 to a voltage potential corresponding to the virtual ground potential.

The DC voltage across the resistor $R_7$ will be zero as both ends DC-wise are tied to virtual ground. The output Q from the D flip-flop 24 is provided as feedback to the input of the second amplifier 52 via a resistor $R_8$. AC wise, the resistor $R_7$ and the resistor $R_8$ act as a voltage divider to the Q output signal from the D flip-flop 24.

The virtual ground potential is determined by the voltage level $V_{ref}$ originating from the battery 23 and the voltage divider provided by the two resistors $R_{10}$ and $R_{11}$.

By arranging the operational amplifier 51 with negative feedback via a capacitor $C_6$, the operational amplifier 51 acts as an integrator producing an output voltage proportional to the integral of the input voltage. Also the operational amplifier 52 and a capacitor $C_9$ provide an integrator functionality The delta sigma converter 10 shown in FIG. 3 acts DC-wise as a first order modulator without any input, and acts AC-wise as a second order modulator for signals above the cut-off frequency determined by the AC filter 50 including the capacitor $C_3$ and a pair of parallel diodes $D_4$ an $D_5$.

The invention claimed is:

1. An integrated circuit component for a hearing assistive device, the integrated circuit component comprising;
    an input node for receiving an audio input signal from an input transducer;
    at least one analog-to-digital converter adapted for receiving said audio input signal and providing a data output for signal processing said analog-to-digital converter having a virtual ground node, and
    an AC filter in a signal path between said input node and said virtual ground node;
    wherein the AC filter is provided with all components integrated in the integrated circuit component and includes a coupling capacitor and a resistive element; and
    wherein the resistive element is provided by a pair of parallel and opposite diodes.

2. The integrated circuit component according to claim 1, wherein the at least one analog to-digital converter comprises a delta sigma converter.

3. The integrated circuit component according to claim 2, wherein the capacitor is connected between a feedback node of the delta sigma converter and said virtual ground node.

4. The integrated circuit component according to claim 1, wherein the diodes are connected between an output of said first amplifier and the virtual ground node.

5. An integrated circuit according to claim 1, wherein said audio input signal is coupled from said input transducer to said analog-to-digital converter without amplification.

6. An integrated circuit according to claim 1, wherein said audio input signal is coupled from said input transducer to said analog-to-digital converter without pre-amplification.

7. An integrated circuit component for a hearing assistive device, the integrated circuit component comprising:
    a delta sigma converter adapted for receiving an electric signal from an input transducer and for providing a data output for signal processing, said delta sigma converter including a first amplifier with a first amplifier input, and
    a filter for preventing dc from the input transducer from reaching said first amplifier input,
    wherein the filter comprises a capacitor and a resistive element provided by a pair of parallel and opposite diodes, and
    wherein the capacitor is connected between an input terminal of the integrated circuit component and said first amplifier input, and the pair of parallel and opposite diodes are connected between an output of said first amplifier and the first amplifier input.

8. The integrated circuit component according to claim 7, wherein the filter is an AC filter having a cut off frequency lower than 100 Hz.

9. The integrated circuit component according to claim 8, wherein the capacitor has a capacitance of no more than approximately 100 pF.

10. A hearing assistive device comprising:
    an input transducer converting sound into an electrical signal,
    a delta sigma converter adapted for receiving the electric signal from the input transducer and for providing a data output for signal processing, said delta sigma converter including a first amplifier having a first amplifier input, and
    a filter for preventing dc from the input transducer from reaching said first amplifier input,
    wherein the filter and the delta sigma converter are contained in an integrated circuit component,
    wherein the filter comprises a capacitor and a resistive element provided by a pair of parallel and opposite diodes, and
    wherein the capacitor is connected between an input terminal of the integrated circuit component and said first amplifier input, and the pair of parallel and opposite diodes are connected between an output of said first amplifier and the first amplifier input.

11. The hearing assistive device according to claim 10, wherein the filter is an AC filter having a cut off frequency lower than 100 Hz.

12. The hearing assistive device according to claim 11, wherein the cut off frequency is lower than 50 Hz.

13. The hearing assistive device according to claim 10, wherein the audio input signal is coupled from the input signal transducer to the delta sigma converter without amplification.

14. The hearing assistive device according to claim 10, wherein the audio input signal is coupled from the input signal transducer to the delta sigma converter without pre-amplification.

15. The hearing assistive device according to claim 10, wherein the capacitor has a capacitance at 100 pF or below.

16. The hearing assistive device according to claim 10, wherein the pair of parallel and opposite diodes provides a feedback loop for the first amplifier in the delta sigma converter and provides the virtual ground at the first amplifier input.

17. The integrated circuit component according to claim 1, wherein said analog-to-digital converter includes a first amplifier and said virtual ground node is prior to said first amplifier in said signal path.

\* \* \* \* \*